(12) United States Patent
Ezaki et al.

(10) Patent No.: US 12,354,890 B2
(45) Date of Patent: Jul. 8, 2025

(54) STAGE AND PLASMA PROCESSING APPARATUS

(71) Applicant: Tokyo Electron Limited, Tokyo (JP)

(72) Inventors: Shota Ezaki, Miyagi (JP); Katsuyuki Koizumi, Miyagi (JP); Masanori Takahashi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 63 days.

(21) Appl. No.: 18/205,168

(22) Filed: Jun. 2, 2023

(65) Prior Publication Data

US 2023/0317474 A1 Oct. 5, 2023

Related U.S. Application Data

(63) Continuation of application No. 16/998,264, filed on Aug. 20, 2020, now Pat. No. 11,784,066.

(30) Foreign Application Priority Data

Aug. 22, 2019 (JP) .................................. 2019-152156

(51) Int. Cl.
*H01L 21/67* (2006.01)
*H01L 21/683* (2006.01)
*H01L 21/687* (2006.01)

(52) U.S. Cl.
CPC .. *H01L 21/67103* (2013.01); *H01L 21/67109* (2013.01); *H01L 21/6833* (2013.01); *H01L 21/68785* (2013.01)

(58) Field of Classification Search
CPC ......... H01L 21/67103; H01L 21/67109; H01L 21/67248; H01L 21/6831; H01L 21/6833; H01L 21/68785
USPC ....................................................... 219/443.1
See application file for complete search history.

(56) References Cited

U.S. PATENT DOCUMENTS

| | | | |
|---|---|---|---|
| 11,784,066 B2 * | 10/2023 | Ezaki | H01L 21/6833 |
| | | | 219/443.1 |
| 2001/0003334 A1 | 6/2001 | Kano et al. | |
| 2008/0023147 A1 | 1/2008 | Yokogawa et al. | |
| 2010/0072189 A1 | 3/2010 | Marchand | |
| 2016/0196991 A1 * | 7/2016 | Shiga | H01J 37/32009 |
| | | | 156/345.26 |
| 2018/0211824 A1 | 7/2018 | Kudo et al. | |

(Continued)

FOREIGN PATENT DOCUMENTS

| | | |
|---|---|---|
| JP | H07-130830 A | 5/1995 |
| JP | 2001-102435 A | 4/2001 |
| JP | 2010-129766 A | 6/2010 |

(Continued)

*Primary Examiner* — Sang Y Paik
(74) *Attorney, Agent, or Firm* — Nath, Goldberg & Meyer; Jerald L. Meyer; Tanya E. Harkins

(57) ABSTRACT

A stage includes a base having an accommodation space therein, a dielectric layer provided on a first surface of the base and having a placement surface on which a substrate is placed, the dielectric layer including therein a plurality of heaters, and a heater control board disposed in the accommodation space and configured to drive the plurality of heaters. The base has an inlet in a second surface thereof that is opposite the first surface, the inlet being configured to introduce a coolant into the accommodation space.

18 Claims, 3 Drawing Sheets

(56) References Cited

U.S. PATENT DOCUMENTS

2018/0309423 A1    10/2018  Okunishi et al.
2019/0013222 A1     1/2019  Kim et al.

FOREIGN PATENT DOCUMENTS

| JP | 2011-082367 A | 4/2011 |
| JP | 2018-206806 A | 12/2018 |
| TW | 201246357 A1 | 11/2012 |
| TW | 201907515 A | 2/2019 |

* cited by examiner

STAGE AND PLASMA PROCESSING APPARATUS

CROSS-REFERENCE TO RELATED APPLICATION

This is a Continuation Application of U.S. patent application Ser. No. 16/998,264, filed Aug. 20, 2020, an application claiming the benefit from Japanese Application No. 2019-152156, filed Aug. 22, 2019, the contents of each of which are hereby incorporated by reference in their entirety.

TECHNICAL FIELD

The present disclosure relates to a stage and a plasma processing apparatus.

BACKGROUND

There is known a stage that attracts a substrate in a processing apparatus that performs a desired process such as an etching process on the substrate.

Patent Document 1 discloses a stage for a plasma processing apparatus, which includes a power-feeding part that provides a transmission path for transmitting high-frequency power from a high-frequency power source, an electrostatic chuck having a plurality of heaters, and a heater controller. Further, it is disclosed that the heater controller is provided in an accommodation space surrounded by the transmission path.

PRIOR ART DOCUMENT

Patent Document

Patent Document 1: Japanese Laid-Open Patent Publication No. 2018-206806

SUMMARY

According to embodiments of the present disclosure, there is provided a stage including: a base having an accommodation space therein; a dielectric layer provided on a first surface of the base and having a placement surface on which a substrate is placed, the dielectric layer including therein a plurality of heaters; and a heater control board disposed in the accommodation space and configured to drive the plurality of heaters, wherein the base has an inlet in a second surface thereof that is opposite the first surface, the inlet being configured to introduce a coolant into the accommodation space.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
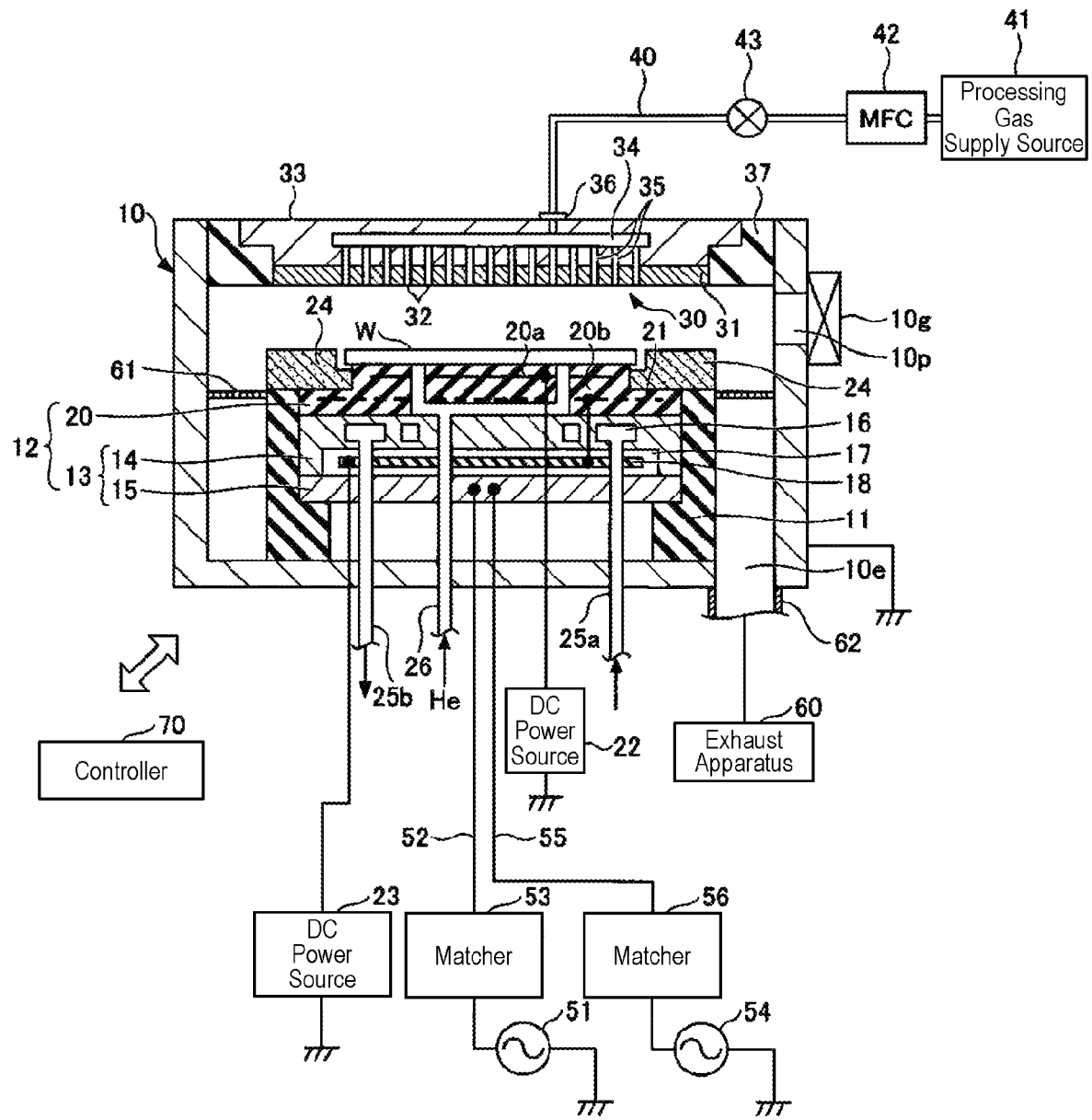
FIG. 1 is a schematic cross-sectional view illustrating an exemplary substrate-processing apparatus according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of the present disclosure will be described with reference to the accompanying drawings. In each of the drawings, the same components are denoted by the same reference numerals, and redundant descriptions may be omitted.

<Substrate-Processing Apparatus>

A substrate-processing apparatus (plasma processing apparatus) 1 according to an embodiment will be described with reference to FIG. 1. FIG. 1 is a schematic cross-sectional view illustrating an exemplary substrate-processing apparatus 1 according to an embodiment.

The substrate-processing apparatus 1 according to an embodiment includes a processing container 10. The processing container 10 has a substantially cylindrical shape having a bottom, and is formed of, for example, aluminum having an anodized surface. The processing container 10 is grounded. A loading/unloading port 10p is formed in the side wall of the processing container 10 so as to transport a wafer W. The loading/unloading port 10p is opened and closed by a gate valve 10g provided along the side wall of the processing container 10.

A support 11 is provided on the bottom portion of the processing container 10. The support 11 is formed of an insulating material. The support 11 has a substantially cylindrical shape and extends upwards from the bottom portion of the processing container 10 in the processing container 10. The support 11 supports the stage 12.

The stage 12 is provided within the processing container 10 and supported by the support 11. The stage 12 includes a base 13 and an electrostatic chuck 20. In addition, the base 13 has a first part 14 serving as a lower electrode and a second part 15 serving as a transmission path for transmitting high-frequency power. The first part 14 and the second part 15 are formed of a conductor such as aluminum. The first part 14 and the second part 15 are electrically connected. An accommodation space 17 for accommodating therein a heater control board 18 to be described later is formed in the base 13.

The electrostatic chuck 20 is provided on the first part 14. The wafer W is placed on the top surface of the electrostatic chuck 20. The electrostatic chuck 20 has a structure in which an electrode 20a made of a conductive film is embedded in a dielectric layer 20b made of a dielectric material. A DC power source 22 is connected to the electrode 20a. By applying a voltage from the DC power source 22 to the electrode 20a, an electrostatic force such as a Coulomb force is generated, and the electrostatic chuck 20 attracts and holds the wafer W.

In addition, the electrostatic chuck 20 has a plurality of heaters 21. The heaters 21 are connected to the DC power source 23 via the heater control board 18. By individually controlling the plurality of heaters 21, the heater control board 18 adjusts the temperature of each zone of a placement surface of the electrostatic chuck 20 so as to adjust the temperature of a wafer W placed on the top surface of the electrostatic chuck 20.

An edge ring 24 is disposed on a peripheral edge portion of the stage 12 so as to surround the edge of the wafer W. The edge ring 24 improves the in-plane uniformity of plasma processing on the wafer W. The edge ring 24 may be formed of, for example, silicon, silicon carbide, or quartz.

A flow path 16 is provided inside the first part 14. A heat exchange medium (e.g., brine or two-phase fluid of gas and liquid) is supplied to the flow path 16 from a chiller unit (not illustrated) provided outside the processing container 10 via a pipe 25a. The heat exchange medium supplied to the flow path 16 exchanges heat with the first part 14. The heat exchange medium discharged from the flow path 16 is returned to the chiller unit through a pipe 25b. As a result, the temperature of the wafer W placed on the electrostatic chuck 20 is adjusted.

The substrate-processing apparatus 1 is provided with a gas supply line 26. The gas supply line 26 supplies a heat transfer gas (e.g., He gas) from a heat transfer gas supply mechanism (not illustrated) to the space between the top surface of the electrostatic chuck 20 and the rear surface of the wafer W.

An upper electrode 30 is provided above the stage 12 so as to face the stage 12. A plasma processing space is formed between the upper electrode 30 and the stage 12.

The upper electrode 30 is provided so as to close the opening in the ceiling of the processing container 10 via an insulative shield member 37. The upper electrode 30 constitutes a surface facing the stage 12, and has an electrode plate 31 having therein a large number of gas ejection holes 32, and an electrode support 33 configured to detachably support the electrode plate 31 and formed of a conductive material (e.g., aluminum having an anodized surface). The electrode plate 31 is made of a silicon-containing material such as silicon or SiC. A gas diffusion chamber 34 is provided inside the electrode support 33, and a large number of gas flow holes 35 communicating with the gas ejection holes 32 extend downwards from the gas diffusion chamber 34.

The electrode support 33 has a gas inlet 36 formed to guide the processing gas to the gas diffusion chamber 34, a gas supply pipe 40 is connected to the gas inlet 36, and a processing gas supply source 41 is connected to the gas supply pipe 40. The gas supply pipe 40 is provided with a mass flow controller (MFC) 42 and an opening/closing valve 43 in this order from the upstream side where the processing gas supply source 41 is disposed. Then, the processing gas from the processing gas supply source 41 passes through the gas supply pipe 40, the gas diffusion chamber 34, and the gas flow holes 35, and is ejected from the gas ejection holes 32 in the form of a shower.

A first high-frequency power source 51 is connected to the second part 15 of the stage 12 via a power-feeding rod 52 and a matcher 53. The first high-frequency power source 51 applies high-frequency (HF) power to the stage 12. The matcher 53 matches the internal impedance of the first high-frequency power source 51 with a load impedance. As a result, plasma is generated from the gas in the plasma processing space. The HF power supplied from the first high-frequency power source 51 may be applied to the upper electrode 30. When applying the HF power to the stage 12, the HF frequency may be in the range of 13 MHz to 100 MHz, and may be, for example, 40 MHz.

A second high-frequency power source 54 is connected to the second part 15 of the stage 12 via a power-feeding rod 55 and a matcher 56. The second high-frequency power source 54 applies low-frequency (LF) power to the stage 12. The matcher 56 matches the internal impedance of the second high-frequency power source 54 with a load impedance. Accordingly, ions are drawn into the wafer W on the stage 12. The second high-frequency power source 54 outputs high-frequency power having a frequency in the range of 400 kHz to 13.56 MHz. A filter necessary for passing predetermined high-frequency power to the ground may be connected to the stage 12.

The LF frequency is lower than the HF frequency. The LF and HF voltages or currents may be continuous waves or pulse waves. In this way, the shower head which supplies the gas, functions as the upper electrode 30, and the stage 12 functions as the lower electrode.

An exhaust port 10e is provided in the bottom portion of the processing container 10, and an exhaust apparatus 60 is connected to the exhaust port 10e via an exhaust pipe 62. The exhaust apparatus 60 has a vacuum pump such as, for example, a turbo molecular pump, and depressurizes the inside of the processing container 10 to a desired degree of vacuum.

An annular baffle plate 61 is provided between the support 11 and the side wall of the processing container 10. As the baffle plate 61, an aluminum material coated with ceramic such as $Y_2O_3$ may be used.

When performing a predetermined process such as an etching process in the substrate-processing apparatus 1 having such a configuration, first, the gate valve 10g is opened, a wafer W is loaded into the processing container 10 through the loading/unloading port 10p, and the wafer W is placed on the stage 12. Then, a processing gas for a predetermined process such as etching is supplied from the processing gas supply source 41 to the gas diffusion chamber 34 at a predetermined flow rate, and is supplied into the processing container 10 through the gas flow holes 35 and the gas ejection holes 32. In addition, the inside of the processing container 10 is exhausted by the exhaust apparatus 60. As a result, the internal pressure is controlled to a set value within the range of, for example, 0.1 to 150 Pa.

HF power is applied to the stage 12 from the first high-frequency power source 51 in the state in which the etching gas is introduced into the processing container 10 in this manner. In addition, LF power is applied from the second high-frequency power source 54 to the stage 12. Further, a DC voltage is applied from the DC power source 22 to the electrode 20a so as to hold the wafer W on the stage 12. Further, a DC voltage is applied from the DC power source 23 to the heaters 21 so as to adjust the temperature of the wafer W.

The gas ejected from the gas ejection holes 32 in the upper electrode 30 is dissociated and ionized mainly by the high-frequency power of HF so as to be turned into plasma, and a process such as etching is performed on the target surface to be processed of the wafer W by radicals and ions in the plasma. In addition, by applying the high-frequency power of LF to the stage 12, the ions in the plasma are controlled to facilitate the process such as etching.

The substrate-processing apparatus 1 is provided with a controller 70 configured to control the overall operation of the apparatus. The CPU provided in the controller 70 executes a desired plasma process such as etching according to a recipe stored in memory such as ROM or RAM. In the recipe, process time, pressure (gas exhaust), high-frequency power of HF and high-frequency power of LF, voltage, and various gas flow rates, which are apparatus control information on process conditions, may be set. In the recipe, for example, the temperatures inside the processing container (e.g., the temperature of the upper electrode, the temperature of the side wall of the processing container, the temperature of the wafer W, and the temperature of the electrostatic chuck) and the temperature of the coolant output from the chiller may be set. In addition, a recipe representing these programs and processing conditions may be stored in a hard disc or semiconductor memory. In addition, the recipe may be set at a predetermined position to be read out in the state of being stored in a non-transitory storage medium readable by a portable computer, such as a CD-ROM or DVD.

Figure 2:
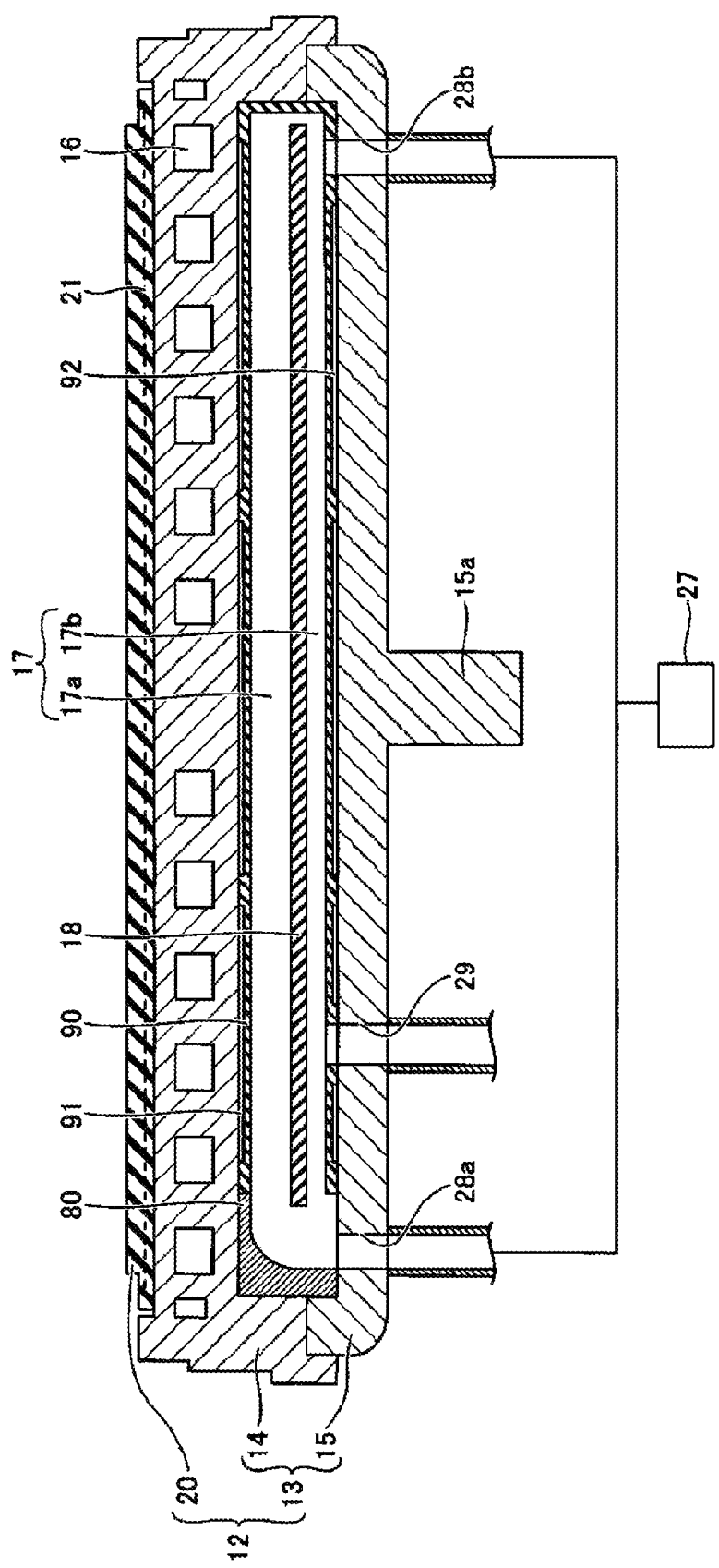
FIG. 2 is a schematic cross-sectional view illustrating an exemplary stage according to an embodiment.

Next, the stage 12 will be further described with reference to FIG. 2. FIG. 2 is a schematic cross-sectional view illustrating an exemplary stage 12 according to an embodiment.

The first part 14 has a substantially disc shape with a recess formed on the bottom surface thereof, and is made of a conductive material such as aluminum. The second part 15 has a substantially disc shape with a recess formed on the top surface thereof, and is made of a conductive material such as aluminum. The base 13 is formed by fitting the second part 15 into the first part 14, and an accommodation space 17 is formed inside the base 13. In addition, the second part 15 is fitted into the first part 14 so as to be electrically connected.

The electrostatic chuck 20 is provided on the first surface (the top surface of the first part 14) of the base 13. A terminal portion 15a is formed in the center of the second surface (the bottom surface of the second part 15) of the base 13, which is the surface opposite the first surface of the base 13. Power-feeding rods 52 and 55 (see FIG. 1) are connected to the terminal portion 15a, and thus high-frequency powers (HF, LF) are applied thereto. The high-frequency waves applied to the terminal portion 15a are transmitted from the second part 15 to the first part 14 serving as the lower electrode.

The heater control board 18 is disposed in the accommodation space 17. On the heater control board 18, devices, such as an FET which is a switching element for individually switching the energization of the plurality of heaters 21, an FPGA for controlling the switching element, a DC-DC converter, and a resistor, are mounted. The DC power source 23 (see FIG. 1) supplies power to the heater control board 18 via a filter (not illustrated). A power-feeding line is wired from the heater control board 18 to each heater 21.

As described above, since the terminal portion 15a is provided at the center of the bottom surface of the second part 15, the accommodation space 17 formed in the base 13 may be surrounded by the high-frequency transmission path. In addition, the heater control board 18 disposed in the accommodation space 17 surrounded by the high-frequency transmission path can distribute the energization to the plurality of heaters 21 to switch them individually. As a result, a filter for suppressing inflow of high-frequency power from the stage 12 to the DC power source 23 may be provided between the heater control board 18 and the DC power source 23, making it possible to reduce the number of filters.

Here, when plasma is generated so as to process the wafer W in the substrate-processing apparatus 1, the temperatures of the wafer W and the stage 12 become high due to the heat input from the plasma. The temperature of the wafer W is adjusted to be, for example, 50 degrees C. to 150 degrees C., and the temperature of the base 13 is adjusted to be, for example, 20 degrees C. to 100 degrees C. Therefore, heat is input to the heater control board 18 from the base 13 (the inner wall surface of the base defining the accommodation space 17). In addition, the devices on the heater control board 18 are also heated. For this reason, the characteristics of the devices (e.g., the switching characteristics of the FET and the resistance value of the resistor) may change, and when the heat is excessively generated, the devices on the heater control board 18 may fail.

When the wafer W is processed at a low temperature in the substrate-processing apparatus 1, a low-temperature heat exchange medium is supplied to the flow path 16, and the temperatures of the wafer W and the stage 12 become low. The temperature of the wafer W is adjusted to, for example, −100 degrees C. to 0 degrees C., and the temperature of the base 13 is adjusted to, for example, −120 degrees C. to 0 degrees C. Therefore, dew condensation may occur on the inner wall of the base 13 defining the accommodation space 17, and the condensed water may adhere to the heater control board 18.

The stage 12 according to the embodiment has inlets 28a and 28b for introducing coolant into the accommodation space 17, and an outlet 29 for discharging the coolant from the accommodation space 17. As the coolant, air blown from a DC fan 27 may be used. In addition, the coolant is not limited thereto, and may be, for example, dry air or an inert gas. Accordingly, the heater control board 18 can be air-cooled. In addition, when a wafer W is processed at a low temperature in the substrate-processing apparatus 1, it is possible to suppress the occurrence of dew condensation.

Here, the inlets 28 a and 28 b and the outlet 29 are provided on the second surface of the base 13, that is, the second part 15. Accordingly, compared with the case where the inlets and the outlet are provided in the side surface of the base 13, it is possible to secure symmetry in the circumferential direction of the stage 12 in the high-frequency transmission path.

Figure 3:
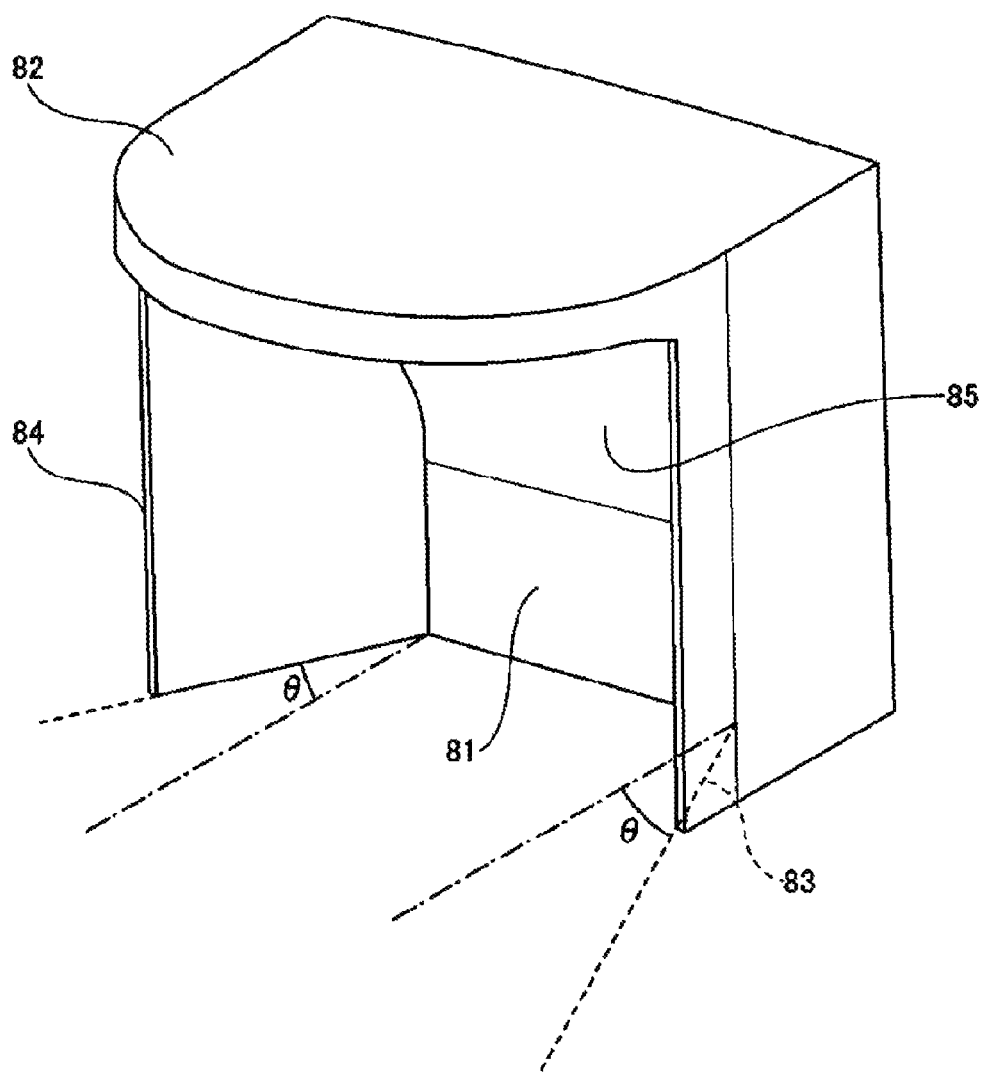
FIG. 3 is a perspective view illustrating an exemplary diffusion member.

The inlet 28a (first inlet port) is provided at a position not covered with the heater control board 18. In other words, the inlet 28a is provided at a position different from the position where the heater control board 18 is disposed when viewed from a direction perpendicular to the placement surface of the stage 12. Diffusion members 80 are provided within the accommodation space 17 in one-to-one correspondence with the inlets 28a. The diffusion member 80 will be further described with reference to FIG. 3. FIG. 3 is a perspective view illustrating an exemplary diffusion member 80.

The diffusion member 80 has a shape in which the lower side and the front side are open. The diffusion member 80 is formed of a material having heat resistance. In addition, the diffusion member 80 is formed of a material having low thermal conductivity. For example, the diffusion member 80 is formed of a resin material such as polyvinyl chloride (PVC) or polyphenylene sulfide (PPS).

The diffusion member 80 has a rear wall portion 81, an upper wall portion 82, and side wall portions 83 and 84. The rear wall portion 81 is formed so as to extend upwards. The upper wall portion 82 is formed so as to extend forwards from the rear wall portion 81. A fillet portion 85 is formed between the inner surface of the rear wall portion 81 and the inner surface of the upper wall portion 82. Accordingly, the inner surface of the rear wall portion 81 and the inner surface of the upper wall portion 82 are continuous surfaces, with the inner surface of the fillet portion 85 interposed therebetween.

The side wall portions 83 and 84 are formed so as to extend forwards from the rear wall portion 81. The inner walls of the side wall portions 83 and 84 are inclined outwards at an angle θ with respect to the front side. That is, the interval between the inner wall of the side wall portion 83 and the inner wall of the side wall portion 84 is formed so as to be widened from the rear side (the side of the rear wall portion 81) toward the front side (the opened side).

As illustrated in FIG. 2, the opened lower side of the diffusion member 80 is disposed so as to correspond to the inlet 28a. Further, the opened front side of the diffusion member 80 is arranged so as to face the center of the accommodation space 17.

The coolant supplied from the DC fan 27 is supplied upwards into the accommodation space 17 from the inlet 28b. The coolant supplied from the inlet 28a into the accommodation space 17 changes its orientation along the inner surface of the rear wall portion 81, the inner surface of the fillet portion 85, and the inner surface of the upper wall portion 82, and is directed toward the center of the accommodation space 17. As a result, the coolant is supplied to the space 17a which is the part of the accommodation space 17 that is above the heater control board 18. Further, some of the coolant is supplied to the space 17b which is the part of the accommodation space 17 that is below the heater control board 18. In addition, since the inner walls of the side wall portions 83 and 84 are formed so as to be widened from the rear side toward the front side, the coolant flows so as to diffuse in a wide range. As a result, the coolant supplied from the inlet 28a into the accommodation space 17 diffuses throughout the accommodation space 17 and cools the heater control board 18.

In addition, since the diffusion member 80 is made of a material having low thermal conductivity, the coolant is prevented from being heated by the heat of the base 13. In addition, it is possible to suppress the first part 14 from being locally cooled by the coolant supplied from the inlet 28a.

The inlet 28b (the second inlet) is provided at a position covered with the heater control board 18. In other words, the inlet 28b is provided at a position overlapping the position where the heater control board 18 is disposed when viewed from a direction perpendicular to the placement surface of the stage 12. That is, the inlet 28b is arranged below the heater control board 18. The coolant supplied from the DC fan 27 is supplied upwards into the accommodation space 17 from the inlet 28b. The coolant supplied from the inlet 28b into the accommodation space 17 is directly injected to the heater control board 18 so as to cool the heater control board 18. Further, the coolant cools the heater control board 18 while flowing through the space 17b.

By directly shooting the coolant to the heater control board 18, it is possible to suppress the first part 14 from being locally cooled by the coolant supplied from the inlet 28b.

The inlet 28b may be provided at, for example, a position spaced apart from the inlet 28a. As a result, since the cooling medium from the inlet 28b can be supplied to the region where cooling by the cooling medium from the inlet 28a decreases, the cooling of the heater control board 18 can be supplemented.

A heat shield plate 90 is provided along the inner wall of the base 13 defining the accommodation space 17. The heat shield plate 90 is formed of a heat-resistant material. The heat shield plate 90 is formed of a material having low thermal conductivity. For example, the heat shield plate 90 is formed of a resin material such as polyvinyl chloride (PVC) or polyphenylene sulfide (PPS). The heat shield plate 90 is provided on a surface of the member defining the accommodation space 17 from an upper side of the accommodation space 17, that is, on a surface of the first part 14 facing the accommodation space 17. By providing the heat shield plate 90, heat conduction from the first part 14 to the heater control board 18 can be suppressed. In addition, when a wafer W is processed at a low temperature in the substrate-processing apparatus 1, it is possible to suppress the occurrence of dew condensation.

A gap 91 is provided between the surface of the first part 14 facing the accommodation space 17 and the heat shield plate 90. Accordingly, it is possible to suppress heat conduction between the first part 14 and the heat shield plate 90, and to further suppress heat conduction from the first part 14 to the heater control board 18.

In addition, the heat shield plate 90 is also provided on a surface of the member defining the accommodation space 17 from a lower side of the accommodation space 17, that is, on a surface of the second part 15 facing the accommodation space 17. As a result, heat conduction to the heater control board 18 from the second part 15 heated or cooled by heat transfer from a portion of the second part 15 that is joined with the first part 14 can be suppressed.

In addition, a gap 92 is provided between the surface of the second part 15 facing the accommodation space 17 and the heat shield plate 90. Accordingly, heat conduction from the second part 15 to the heater control board 18 can be further suppressed.

Further, a water-absorbing sheet or a moisture-absorbing sheet may be attached to the heat shield plate 90. Accordingly, it is possible to further suppress adhesion of the condensed water to the heater control board 18.

As described above, with the stage 12 according to the embodiment, the heater control board 18 can be appropriately cooled, and thus the heater control board 18 can be stably operated. Moreover, dew condensation can be prevented.

In the foregoing, the embodiment of a substrate-processing apparatus 1 or the like has been described. However, the present disclosure is not limited to the above-described embodiment or the like, and can be variously modified and improved within the scope of the present disclosure described in the claims.

In FIG. 2, the number of inlets 28a and 28b and the number of outlets 29 are illustrated as two and one, respectively. The numbers are not limited to thereto, and multiple outlets 29 may be provided.

Although the power source of the heater 21 is described as a DC power source 23, it may be an AC power source.

According to an aspect, it is possible to provide a stage and a plasma processing apparatus that improve the stability of operations of a board disposed in the accommodation space inside the stage.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A substrate processing apparatus comprising:
a chamber;
a substrate support disposed in the chamber, the substrate support including:

a conductive base having an upper portion and a lower portion, the upper portion being electrically connected to the lower portion, the upper portion having a flow path, an accommodation space being formed between the upper portion and the lower portion;

an electrostatic chuck disposed on the conductive base;

a plurality of heaters disposed in the electrostatic chuck; and a heater control board disposed in the accommodation space and configured to drive the plurality of heaters; and a fan configured to supply a fluid into the accommodation space, wherein a heat exchange medium is supplied to the flow path from outside the chamber.

2. The substrate processing apparatus according to claim 1, wherein the fluid is air.

3. The substrate processing apparatus according to claim 1, wherein the fluid is dry air.

4. The substrate processing apparatus according to claim 1, wherein the fluid is an inert gas.

5. The substrate processing apparatus according to claim 1, further comprising:

a heat shield plate disposed in the accommodation space.

6. The substrate processing apparatus according to claim 5, wherein the heat shield plate is disposed between an upper surface defining the accommodation space and the heater control board.

7. The substrate processing apparatus according to claim 6, wherein a gap is formed between the upper surface defining the accommodation space and the heat shield plate.

8. The substrate processing apparatus according to claim 7, further comprising:

a diffusion member disposed in the accommodation space and configured to diffuse the fluid supplied into the accommodation space.

9. The substrate processing apparatus according to claim 8, wherein the diffusion member is configured to change an orientation of a flow of the fluid supplied into the accommodation space such that the fluid flows between the upper surface defining the accommodation space and the heater control board.

10. The substrate processing apparatus according to claim 9, wherein the diffusion member is formed of a material having a lower thermal conductivity than a thermal conductivity of the conductive base.

11. The substrate processing apparatus according to claim 1, wherein the lower portion of the conductive base has at least one inlet configured to supply the fluid from the fan into the accommodation space.

12. The substrate processing apparatus according to claim 11, wherein the lower portion of the conductive base has at least one outlet configured to discharge the fluid supplied into the accommodation space.

13. A substrate processing apparatus comprising:

a chamber;

a substrate support disposed in the chamber, the substrate support including:

a base having an upper portion and a lower portion, an accommodation space being formed between the upper portion and the lower portion;

an electrostatic chuck disposed on the base;

a plurality of heaters; and a heater control board disposed in the accommodation space and configured to drive the plurality of heaters; and a fan configured to supply a fluid into the accommodation space.

14. The substrate processing apparatus according to claim 13, wherein the fluid is air.

15. The substrate processing apparatus according to claim 13, wherein the fluid is dry air.

16. The substrate processing apparatus according to claim 13, wherein the fluid is an inert gas.

17. The substrate processing apparatus according to claim 13, wherein the lower portion of the base has at least one inlet configured to supply the fluid from the fan into the accommodation space.

18. The substrate processing apparatus according to claim 17, wherein the lower portion of the base has at least one outlet configured to discharge the fluid supplied into the accommodation space.

* * * * *